(12) United States Patent
Horitani et al.

(10) Patent No.: US 10,403,456 B2
(45) Date of Patent: Sep. 3, 2019

(54) ARTICLE HANDLING DEVICE

(71) Applicant: Ishida Co., Ltd., Kyoto (JP)

(72) Inventors: Yoshiki Horitani, Ritto (JP); Mikio Kishikawa, Ritto (JP); Naomi Imaaki, Ritto (JP)

(73) Assignee: Ishida Co., Ltd., Kyoto (JP)

( * ) Notice: Subject to any disclaimer, the term of this patent is extended or adjusted under 35 U.S.C. 154(b) by 89 days.

(21) Appl. No.: 15/519,123

(22) PCT Filed: Oct. 8, 2015

(86) PCT No.: PCT/JP2015/078642
§ 371 (c)(1),
(2) Date: Apr. 13, 2017

(87) PCT Pub. No.: WO2016/067883
PCT Pub. Date: May 6, 2016

(65) Prior Publication Data
US 2017/0229262 A1    Aug. 10, 2017

(30) Foreign Application Priority Data

Oct. 31, 2014    (JP) .................................. 2014-223333

(51) Int. Cl.
*H01H 23/06*    (2006.01)
*H05K 5/02*    (2006.01)
(Continued)

(52) U.S. Cl.
CPC ............ *H01H 23/06* (2013.01); *B65G 65/40* (2013.01); *G01G 19/387* (2013.01);
(Continued)

(58) Field of Classification Search
CPC combination set(s) only.
See application file for complete search history.

(56) References Cited

U.S. PATENT DOCUMENTS 3,686,425 A * 8/1972 Zerwes ................. H02B 1/44
174/53
4,289,361 A * 9/1981 Riedel ................. H02B 1/30
312/100
(Continued)

FOREIGN PATENT DOCUMENTS

CN    103026187 A    4/2013
EP    0 362 567 A2    4/1990
(Continued)

OTHER PUBLICATIONS

Computer translation of JP 2013-161853 from the JPO website. Oct. 23, 2018.*
(Continued)

*Primary Examiner* — Randy W Gibson
(74) *Attorney, Agent, or Firm* — Studebaker & Brackett PC

(57) ABSTRACT

Provided is an article processing apparatus capable of improving waterproofness. An article processing apparatus (1) includes: a storage case (130) which stores an electric circuit portion and has an opening (131) at a side surface (130c) thereof; and a lid (140) which seals the opening (131), in which the storage case (130) has an upper surface (130a) which is inclined downward toward the side surface (130c) side, and an amount of protrusion of a lower end (E) of the upper surface (130a) from the side surface (130c) is greater than an amount of protrusion of the lid (140) from the side surface (130c).

6 Claims, 8 Drawing Sheets

(51) Int. Cl.
    *H05K 5/03*            (2006.01)
    *G01G 19/387*     (2006.01)
    *B65G 65/40*      (2006.01)
    *H01H 23/00*      (2006.01)

(52) U.S. Cl.
    CPC ............... *H01H 23/00* (2013.01); *H05K 5/02* (2013.01); *H05K 5/0213* (2013.01)

(56) References Cited

U.S. PATENT DOCUMENTS

| | | | | |
|---|---|---|---|---|
| 5,418,683 | A * | 5/1995 | Orchard | H02B 1/40 |
| | | | | 361/663 |
| 6,527,135 | B1 | 3/2003 | Braun et al. | |
| 9,234,787 | B2 * | 1/2016 | Nagai | G01G 19/393 |
| 2014/0247539 | A1 * | 9/2014 | Valencic | H02B 1/30 |
| | | | | 361/623 |

FOREIGN PATENT DOCUMENTS

| | | |
|---|---|---|
| JP | H02-167434 A | 6/1990 |
| JP | H06-038316 A | 2/1994 |
| JP | H09-1086 A | 1/1997 |
| JP | 2001-048287 A | 2/2001 |
| JP | 2001-255199 A | 9/2001 |
| JP | 2002-139371 A | 5/2002 |
| JP | 2002-325316 A | 11/2002 |
| JP | 2005-077370 A | 3/2005 |
| JP | 2006-125903 A | 5/2006 |
| JP | 2008-066445 A | 3/2008 |
| JP | 2009-270985 A | 11/2009 |
| JP | 2011-047651 A | 3/2011 |
| JP | 2013-161853 A | 8/2013 |
| JP | 2014-134423 A | 7/2014 |
| JP | 2016-092135 A | 5/2016 |

OTHER PUBLICATIONS

The extended European search report issued by the European Patent Office dated Jun. 14, 2018, which corresponds to European Patent Application No. 15853891.8-1203 and is related to U.S. Appl. No. 15/519,123.

An Office Action mailed by the Japanese Patent Office dated Jul. 24, 2018, which corresponds to Japanese Patent Application No. 2014-223333 and is related to U.S. Appl. No. 15/519,123.

Notification of Transmittal of International Preliminary Report on Patentability and Translation of Written Opinion of the International Searching Authority; PCT/JP2015/078642; dated May 11, 2017.

An Office Action mailed by the State Intellectual Property Office of People's Republic of China dated Jan. 23, 2019, which corresponds to Chinese Patent Application No. 201580058348.9 and is related to U.S. Appl. No. 15/519,123.

International Search Report issued in PCT/JP2015/078642; dated Jan. 12, 2016.

An Office Action mailed by the Japanese Patent Office dated Jul. 30, 2019, which corresponds to Japanese Patent Application No. 2018-159544 and is related to U.S. Appl. No. 15/519,123.

* cited by examiner

ARTICLE HANDLING DEVICE

TECHNICAL FIELD

The present invention relates to an article processing apparatus.

BACKGROUND ART

As an article processing apparatus used in a production line of an article, there is a combination weighing apparatus. The combination weighing apparatus includes: a dispersion supply portion which disperses and supplies a weighing object to the surroundings; a plurality of hoppers which are circumferentially arranged around the dispersion supply portion, each weigh a predetermined amount of the weighing object so as to be selectively dropped and discharged; and a collection chute which is disposed below the hoppers and collects and discharges the discharged weighing object (for example, refer to Patent Literature 1). An electric circuit and the like of the combination weighing apparatus are stored in a control box.

CITATION LIST

Patent Literature

Patent Literature 1: Japanese Unexamined Patent Publication No. 2001-255199

SUMMARY OF INVENTION

Technical Problem

In the combination weighing apparatus, in a case where an article for which sanitation has to be considered, such as food, is a weighing object, cleaning is performed. During the cleaning, cleaning water is also applied to the control box. The control box is provided with a lid that can be opened and closed for an operator to perform an operation. In this configuration, cleaning water infiltrates into the control box between the control box and the lid. The infiltration of the cleaning water into the control box causes problems such as a short circuit of the electric circuit. Therefore, infiltration of cleaning water and the like into the control box has to be prevented.

An object of the present invention is to provide an article processing apparatus capable of improving waterproofness.

Solution to Problem

An article processing apparatus according to an aspect of the present invention is an article processing apparatus which is used in a production line of an article and processes the article, including: a storage case which stores an electric circuit portion and has an opening at a side surface thereof; and a lid which seals the opening, in which the storage case has an upper surface which is inclined downward toward the side surface side, and an amount of protrusion of a lower end of the upper surface from the side surface is greater than an amount of protrusion of the lid from the side surface.

In the article processing apparatus, the storage case has the upper surface which is inclined downward toward the side surface side. Accordingly, cleaning water or the like adhered to the upper surface flows toward the lower end. Therefore, the accumulation of the cleaning water or the like on the upper surface can be prevented. In addition, the amount of protrusion of the lower end of the upper surface from the side surface is greater than the amount of protrusion of the lid from the side surface. Accordingly, the cleaning water or the like discharged from the lower end of the upper surface is less likely to be caught on the lid. Therefore, the infiltration of the cleaning water or the like between the storage case and the lid can be prevented. As a result, an improvement in waterproofness can be achieved.

In an embodiment, the storage case includes a protruding portion which is disposed along at least an upper side edge portion of the opening and is covered by the lid, the protruding portion has an overhanging portion which overhangs toward outside from the side surface and extends along the side surface, and the overhanging portion is inclined downward such that at least one end portion in an extension direction thereof serves as a lower end. When the lid is detached from the storage case, the cleaning water or the like may adhere to the protruding portion in some cases. At this time, since at least one end portion in the extension direction of the overhanging portion is inclined so as to serve as the lower end, the cleaning water or the like flows along the overhanging portion and is discharged. Therefore, the accumulation of the cleaning water or the like in the protruding portion can be prevented, and the infiltration of the cleansing water or the like into the storage case can be prevented.

In the embodiment, the storage case is attached to an apparatus body, and the upper surface is inclined downward from the apparatus body side toward the outside. Accordingly, the cleaning water or the like adhered to the upper surface easily falls to the outside of the apparatus body. Therefore, it is possible to prevent the cleaning water or the like from falling to the inside of the apparatus body or immediately therebelow, and a further improvement in sanitation can be achieved.

In the embodiment, in the storage case, a convex portion, which is constituted by a first inclined surface on the lower end side of the upper surface, and a second inclined surface that extends from the lower end of the first inclined surface and is inclined in a direction opposite to the first inclined surface is disposed along the side surface. As described above, by disposing the convex portion along the side surface, the rigidity of the storage case can be increased.

In the embodiment, an angle between the second inclined surface and the side surface is an obtuse angle. In a case where the corner formed by the second inclined surface and the side surface has an acute angle, the corner is less likely to be seen and cannot be easily cleaned. In addition, the cleaning water, articles, and the like are likely to be accumulated at the corner, and there is a concern that sanitation may be degraded. Therefore, by setting the angle between the second inclined surface and the side surface to be an obtuse angle, it is possible to prevent the cleaning water or the like from accumulating at the corner, thereby improving sanitation.

In the embodiment, a dispersion table which disperses the article; a plurality of weighing hoppers which weigh the article supplied from the dispersion table; and a collection chute which is disposed below the weighing hoppers and collects the article discharged from the weighing hoppers are further included. With this configuration, the article processing apparatus can function as a combination weighing apparatus.

In the embodiment, a support frame which supports the dispersion table and the plurality of weighing hoppers; and a body frame which supports the support frame are further included, in which the other side surface of the storage case which opposes the side surface is fixed to the body frame and is attached to the body frame. In this configuration, the upper surface is inclined downward from the body frame side toward the outside. Therefore, the cleaning water or the like adhered to the upper surface easily falls to the outside of the body frame. Therefore, it is possible to prevent the cleaning water or the like from falling to the inside of the apparatus body or immediately therebelow, and a further improvement in sanitation can be achieved.

Advantageous Effects of Invention

According to the present invention, an improvement in waterproofness can be achieved.

DESCRIPTION OF EMBODIMENTS

Figure 1:
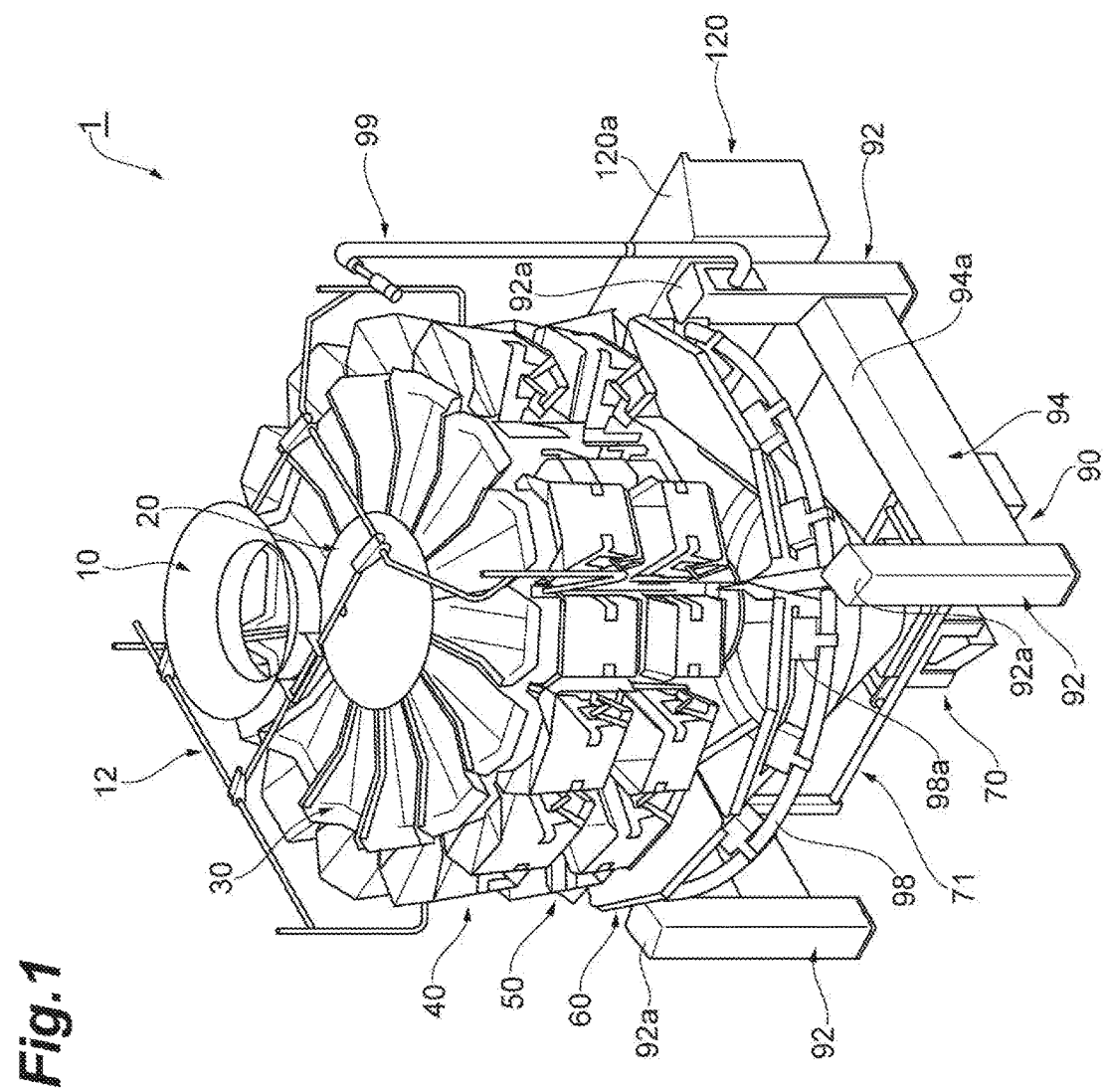
FIG. 1 is a perspective view of a combination weighing apparatus according to an embodiment.

Hereinafter, preferred embodiments of the present invention will be described in detail with reference to the accompanying drawings. In the description of the drawings, like elements which are the same or similar to each other are denoted by like reference numerals, and redundant description will be omitted.

(1) Overall Configuration

Figure 2:
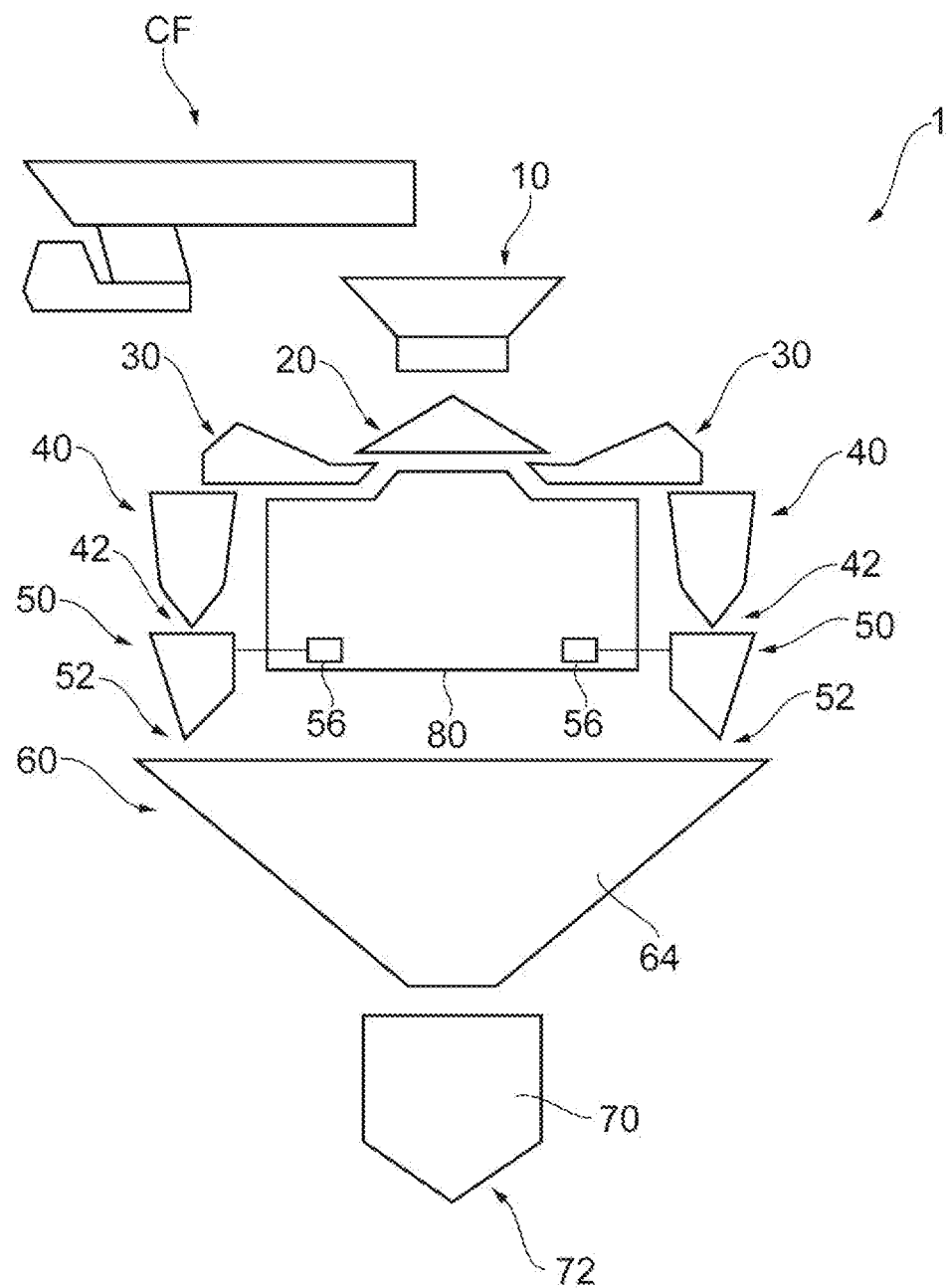
FIG. 2 is a view schematically illustrating the configuration of the combination weighing apparatus.
Figure 3:
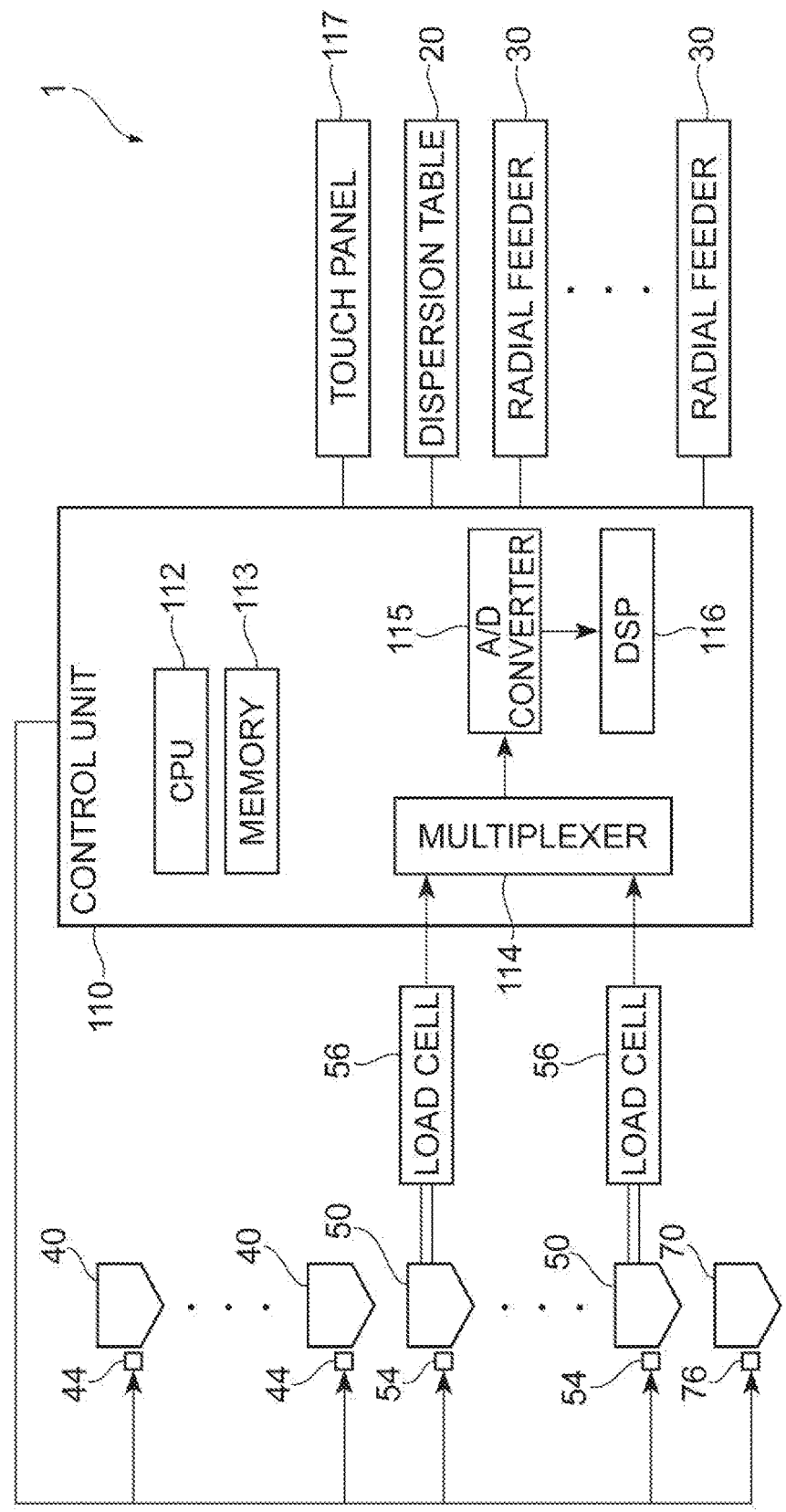
FIG. 3 is a block configuration diagram of the combination weighing apparatus.
Figure 4:
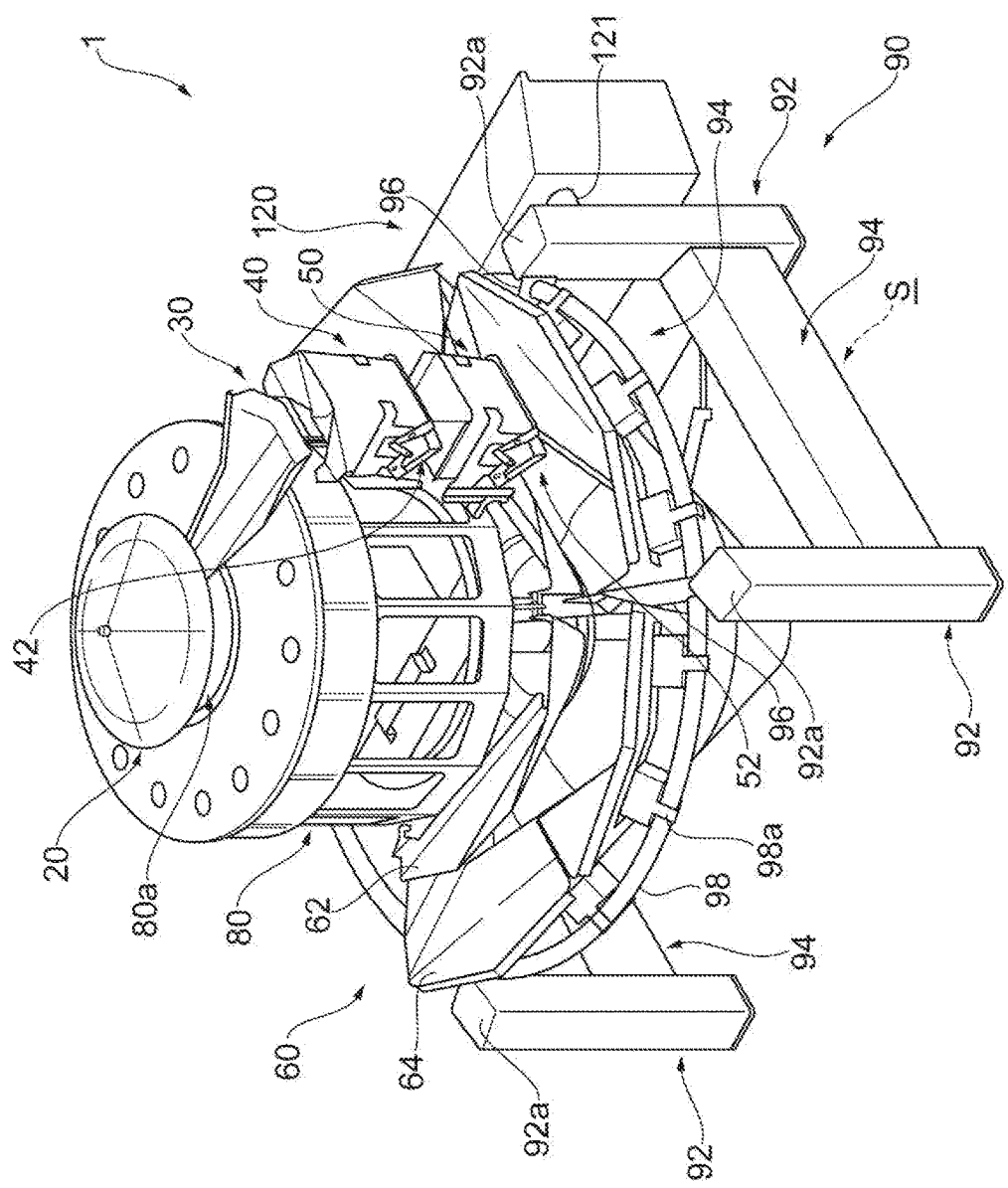
FIG. 4 is a perspective view illustrating a state in which some components are removed from the combination weighing apparatus illustrated in FIG. 1.

FIG. 1 is a perspective view of a combination weighing apparatus according to an embodiment. FIG. 2 is a view schematically illustrating the configuration of the combination weighing apparatus. FIG. 3 is a block configuration diagram of the combination weighing apparatus. FIG. 4 is a perspective view illustrating a state in which some components are removed from the combination weighing apparatus illustrated in FIG. 1.

The combination weighing apparatus (article processing apparatus) 1 includes an article supply chute 10, a dispersion table 20, a plurality of radial feeders 30, a plurality of pool hoppers 40, a plurality of weighing hoppers 50, a collection discharge chute section 60, a timing hopper 70, a weighing mechanism frame (support frame) 80, a body frame 90, a control unit 110, and an electric box 120.

The combination weighing apparatus 1 having the above configuration functions as follows. Articles as weighing objects of the combination weighing apparatus 1 are conveyed to the combination weighing apparatus 1 by a cross feeder CF. The articles are, for example, foods. The articles conveyed by the cross feeder CF are input to the article supply chute 10. The articles input to the article supply chute 10 are supplied to the dispersion table 20. The dispersion table 20 conveys the articles while dispersing the articles and supplies the articles to the plurality of radial feeders 30 arranged around the dispersion table 20. Each of the radial feeders 30 conveys the articles supplied from the dispersion table 20 to the pool hopper 40 provided corresponding to each radial feeder 30, and supplies the articles to the pool hopper 40.

Each of the pool hoppers 40 supplies the articles to the weighing hopper 50 disposed below the pool hopper 40. The control unit 100 performs a combination weighing calculation based on a measured value (a measured value of the article in the weighing hopper 50) of a load cell 56 included in the weighing hopper 50, which will be described later, and selects an article combination which is closest to a target value in a predetermined allowable range of the result of the combination weighing calculation. The weighing hopper 50 included in the selected combination supplies the articles to the collection discharge chute section 60. The collection discharge chute section 60 supplies the articles to the timing hopper 70. The timing hopper 70 supplies the articles to, for example, a bag making and packaging machine or the like installed in a subsequent stage of the combination weighing apparatus 1.

(2) Detailed Configuration

Subsequently, the configuration of the combination weighing apparatus 1 will be described in detail.

(2-1) Article Supply Chute

As illustrated in FIG. 1, the article supply chute 10 is disposed below the end portion of the cross feeder CF (see FIG. 2) which inputs the articles to the article supply chute 10 (the end portion on a side on which the articles are input to the article supply chute 10). In addition, the article supply chute 10 is disposed above the dispersion table 20. The article supply chute 10 is supported by a support frame 12. The article supply chute 10 is supplied with the articles conveyed by the cross feeder CF and supplies the articles to the dispersion table 20.

(2-2) Dispersion Table

The dispersion table 20 is a table-like member formed in a conical shape. The dispersion table 20 is supplied with the articles from the cross feeder CF installed above the dispersion table 20 via the article supply chute 10. The dispersion table 20 is vibrated by, for example, an electromagnet (not illustrated) so as to convey the supplied articles in a radially outward direction while dispersing the articles in a circumferential direction. The dispersion table 20 supplies the articles conveyed to the outer edge to the plurality of radial feeders 30 disposed below the outer edge side of the dispersion table 20.

(2-3) Radial Feeder

The combination weighing apparatus 1 has the plurality of (here, 14) radial feeders 30. The plurality of radial feeders 30 are annularly arranged around the dispersion table 20. The plurality of radial feeders 30 extend radially from the dispersion table 20 as the center.

Each of the radial feeders 30 is vibrated by, for example, an electromagnet (not illustrated) so as to convey the articles supplied from the dispersion table 20 in the radially outward direction (a direction away from the dispersion table 20). Each of the radial feeders 30 supplies the articles conveyed to the outer edge to the pool hopper 40 disposed below the outer edge side of each of the radial feeders 30.

(2-4) Pool Hopper

The combination weighing apparatus 1 has the same number of pool hoppers 40 as that of the radial feeders 30. As illustrated in FIG. 4, one pool hopper 40 is disposed below the outer edge side of each of the radial feeders 30. The pool hoppers 40 temporarily store the articles supplied from the radial feeders 30 disposed thereabove.

A PH gate 42 is provided in the lower portion of each of the pool hoppers 40. The pool hopper 40 supplies the articles in the pool hopper 40 to the weighing hopper 50 disposed below the pool hopper 40 when the PH gate 42 is opened. Each of the PH gates 42 is opened and closed as a link mechanism (not illustrated) is operated by a stepping motor 44. The operation of the stepping motor 44 is controlled by the control unit 100.

(2-5) Weighing Hopper

The combination weighing apparatus 1 has the same number of weighing hoppers 50 as that of the pool hoppers 40. One weighing hopper 50 is disposed below each of the pool hoppers 40. The weighing hopper 50 measures the weight of the article supplied from the pool hopper 40, that is, the weight of the article supplied from the radial feeder 30 via the pool hopper 40.

A WH gate 52 is provided in the lower portion of each of the weighing hoppers 50. The weighing hopper 50 supplies the articles in the weighing hopper 50 to the collection discharge chute section 60 when the WH gate 52 is opened. Each of the WH gates 52 is opened and closed as a link mechanism (not illustrated) is operated by a stepping motor 54. The operation of the stepping motor 54 is controlled by the control unit 100.

Each of the weighing hoppers 50 has a load cell 56 for weighing the article held by the weighing hopper 50. The load cell 56 is an example of a weighing mechanism. The load cell 56 transmits a weighing signal indicating the weighing result to a multiplexer 114 of the control unit 100, which will be described later, via an amplifier (not illustrated).

(2-6) Collection Discharge Chute Section

The collection discharge chute section 60 is an example of a discharge path member. The collection discharge chute section 60 has an inner chute 62 and an outer chute (collection chute) 64 disposed around the inner chute 62. The inner chute 62 is a chute for dust. The inner chute 62 has a conical shape. Articles (dust) and the like deviated from the main discharge path are supplied to the inner chute 62.

After combination weighing based on the weighing result of the load cell 56, the weighed articles of the selected combination are supplied from the weighing hopper 50 to the outer chute 64. The outer chute 64 collects the articles supplied from the weighing hopper 50 and supplies the articles to the timing hopper 70.

(2-7) Timing Hopper

The timing hopper 70 delivers the articles supplied from the outer chute 64 to the bag making and packaging machine or the like in the subsequent stage. The timing hopper 70 is supported by a support frame 71. A gate 72 is provided in the lower portion of the timing hopper 70. The timing hopper 70 supplies the articles in the timing hopper 70 to the bag making and packaging machine or the like in the subsequent stage when the gate 72 is opened. The gate 72 is opened and closed as a link mechanism (not illustrated) is operated by a stepping motor 76. The operation of the stepping motor 76 is controlled by the control unit 100. While the gate 72 is closed, the timing hopper 70 receives the weighing objects sliding down from the outer chute 64 and holds the weighing objects therein. As the gate 72 is opened, the timing hopper 70 sends the weighing objects held therein toward the lower side, and delivers the articles to the bag making and packaging machine or the like in the subsequent stage.

(2-8) Weighing Mechanism Frame

As illustrated in FIG. 4, the weighing mechanism frame 80 is a frame formed in a cylindrical shape. The weighing mechanism frame 80 mainly supports the dispersion table 20, the radial feeders 30, the pool hoppers 40, and the weighing hoppers 50. The weighing mechanism frame 80 supports the dispersion table 20 and the radial feeders 30 from below. Specifically, an upper protrusion 80*a* provided at the center of the weighing mechanism frame 80 supports the dispersion table 20. A portion of the circumferential edge of the upper protrusion 80*a* lower than the upper protrusion 80*a* supports the radial feeders 30. The pool hoppers 40 and the weighing hoppers 50 are attached to the side surface of the weighing mechanism frame 80. In addition, in FIG. 4, a state in which parts of the radial feeders 30, the pool hoppers 40, and the weighing hoppers 50 are removed from the combination weighing apparatus 1 is illustrated.

Various devices are stored in the weighing mechanism frame 80. Specifically, the electromagnet (not illustrated) for vibrating the dispersion table 20, the electromagnet (not illustrated) for vibrating the radial feeders 30, the stepping motors 44 which drive the PH gates 42 of the pool hoppers 40, the stepping motors 54 which drive the WH gates 52 of the weighing hoppers 50, the load cells 56 of the weighing hoppers 50, and the like are stored in the weighing mechanism frame 80.

(2-9) Body Frame

The body frame 90 includes four support columns 92 disposed in an up and down direction, three beam members 94 disposed between the support columns 92, four weighing machine support frames 96, and an annular support frame 98. The support columns 92 and the beam members 94 are connected by the beam members 94 between adjacent support columns 92. The support columns 92 and the beam members 94 are formed in a U shape in a plan view.

The support column 92 is a hollow member in which the horizontal section is formed in a square shape. The support column 92 is constituted by flat surfaces. The opening of the upper end of the support column 92 is blocked by a plate-like member on flat plates. The support column 92 has a greater dimension in the up and down direction than a dimension in a horizontal direction. An upper surface 92*a* of the support column 92 is inclined with respect to a horizontal plane so as to prevent dust adhered thereto, cleaning water adhered during cleaning, and the like from falling on the apparatus body side (the inside of the body frame 90 (a side on which the weighing mechanism frame 80 and the collection discharge chute section 60 are disposed)). Specifically, the upper surface 92*a* of the support column 92 is inclined downward from the apparatus body side toward the outside.

The support column 92 is provided with a camera device 99. The camera device 99 images, for example, the dispersed state of the articles in the dispersion table 20.

The beam member 94 is a member that extends horizontally. The beam member 94 is constituted by flat surfaces. In this embodiment, the beam member 94 is a member that extends horizontally between the support columns 92. A space S is formed below each of the beam members 94. As the space S is formed below the beam member 94, it is easy to secure cleanliness below the combination weighing apparatus 1.

The beam member 94 is a hollow member in which the vertical section is formed in a quadrangular shape. The vertical section of the beam member 94 has a parallelogram shape. Specifically, the vertical section of the beam member 94 has a parallelogram shape that extends longer in the up and down direction than in the horizontal direction. The upper surface 94*a* in the vertical section of the beam member 94 is inclined downward from the apparatus body side toward the outside. In other words, the upper surface 94*a* in the vertical section of the beam member 94 is inclined downward from the side on which the weighing mechanism frame 80 and the collection discharge chute section 60 are disposed toward a side on which the weighing mechanism frame 80 and the collection discharge chute section 60 are not disposed.

The lower surface (not illustrated) in the vertical section of the beam member 94 is also inclined downward from the inside toward the outside of the body frame 90. In other words, the lower surface in the vertical section of the beam member 94 is inclined downward from the side on which the weighing mechanism frame 80 and the collection discharge chute section 60 are disposed toward the side on which the weighing mechanism frame 80 and the collection discharge chute section 60 are not disposed. The side surface in the vertical section of the beam member 94 extends vertically (in the up and down direction). It is preferable that the upper surface 94a and the lower surface are inclined by, for example, 15 degrees or more with respect to the horizontal plane.

The weighing machine support frames 96 are disposed between the weighing mechanism frame 80 and the support columns 92. The weighing machine support frames 96 are members that connect the weighing mechanism frame 80 to the support columns 92. The weighing machine support frame 96 is a hollow member constituted by flat surfaces. The weighing machine support frame 96 has a greater dimension in the up and down direction than a dimension in the horizontal direction. The weighing machine support frames 96 are provided respectively for the support columns 92. Each of the weighing machine support frames 96 extends obliquely upward from the corresponding support column 92 toward the weighing mechanism frame 80. The weighing machine support frame 96 connects the lower portion of the weighing mechanism frame 80 to the upper portion of the support column 92 of the body frame 90, which will be described later.

The weighing machine support frames 96 are supported by the support columns 92. The weighing machine support frames 96 support the weighing mechanism frame 80. That is, the support columns 92 support the weighing mechanism frame 80 via the weighing machine support frames 96.

The annular support frame 98 supports the outer chute 64 of the collection discharge chute section 60. The annular support frame 98 has an annular shape. In this embodiment, the section of the annular support frame 98 has a true circle shape. In the section of the annular support frame 98, the entire surface including the upper surface is curved. The annular support frame 98 supports the outer chute 64 by a hook 98a. The hook 98a is provided at the upper portion of the outer circumferential surface of the outer chute 64. The hook 98a is engaged with the annular support frame 98. The outer chute 64 is provided so as to be detachable from the annular support frame 98 by the hook 98a. The annular support frame 98 may be integrally formed, or may be formed by a combination of a plurality of members.

The annular support frame 98 is supported by the weighing machine support frames 96 of the body frame 90. Specifically, a through-hole (not illustrated) is formed in the vicinity of the lower end portion of the weighing machine support frame 96 joined to the support column 92. The annular support frame 98 is inserted through the through-holes and is thus supported by the weighing machine support frames 96.

The body frame 90 is disposed on a stand (not illustrated). Below the stand, apparatuses (not illustrated) such as the bag making and packaging machine are disposed. The timing hopper 70 supplies the articles to the apparatuses.

(2-10) Control Unit

The control unit 100 includes a CPU (Central Processing Unit) 112 and a memory 113 such as a ROM (Read Only Memory) and a RAM (Random Access Memory) (see FIG. 2). Furthermore, the control unit 100 includes the multiplexer 114, an A/D converter 115, and a DSP (digital signal processor) 116 (see FIG. 2).

According to a command of the DSP 116, the multiplexer 114 selects one weighing signal from among the weighing signals of the load cells 56 and transmits the selected weighing signal to the A/D converter 115. The A/D converter 115 converts the weighing signal (analog signal) received from the multiplexer 114 into a digital signal according to a timing signal transmitted from the DSP 116, and transmits the digital signal to the DSP 116. The DSP 116 performs filter processing on the digital signal transmitted from the A/D converter 115.

The control unit 100 is connected to each unit of the combination weighing apparatus 1 such as the dispersion table 20, the radial feeders 30, the stepping motor 44, the stepping motor 54, the stepping motor 76, and a touch panel 117. In addition, the touch panel 117 is a liquid crystal display (LCD) having both input and output functions, and functions as an input unit and an output unit. The touch panel 117 receives inputs of various settings related to combinational weighing. For example, the touch panel 117 receives inputs of operation parameters such as vibration intensities of the dispersion table 20 and the radial feeders 30, and vibration times of the radial feeders 30. In the control unit 100, the CPU 112 controls each unit of the combination weighing apparatus 1 by executing programs stored in the memory 113.

Specifically, the control unit 100 performs, for example, the following control. For example, based on the operation parameters such as the vibration intensities of the dispersion table 20 and the radial feeders 30 and the vibration times of the radial feeder 30s, the control unit 100 controls the electromagnets (not illustrated) of the dispersion table 20 and the radial feeders 30 so as to vibrate the dispersion table 20 and the radial feeders 30.

Furthermore, for example, the control unit 100 performs the combination weighing calculation based on the measured values in the weighing hoppers 50. Specifically, the control unit 100 calculates the weights of the articles held in the respective weighing hoppers 50 by using the signal filtered by the DSP 116, and performs the combination weighing calculation so as to cause the sum of the weights to be closest to a target value in a predetermined target weight range. In addition, the control unit 100 determines the combination of the weighing hoppers 50 based on the result of the combination weighing calculation, and controls the operation of the stepping motor 54 so that the WH gate 52 of the determined weighing hopper 50 is opened. Furthermore, in a case where any of the weighing hoppers 50 is empty, the control unit 100 opens the PH gate 42 of the pool hopper 40 disposed above the empty weighing hopper 50 by operating the stepping motor 44. Moreover, the control unit 100 controls opening and closing of the gate 72 of the timing hopper 70.

(2-11) Electric Box

Figure 5:
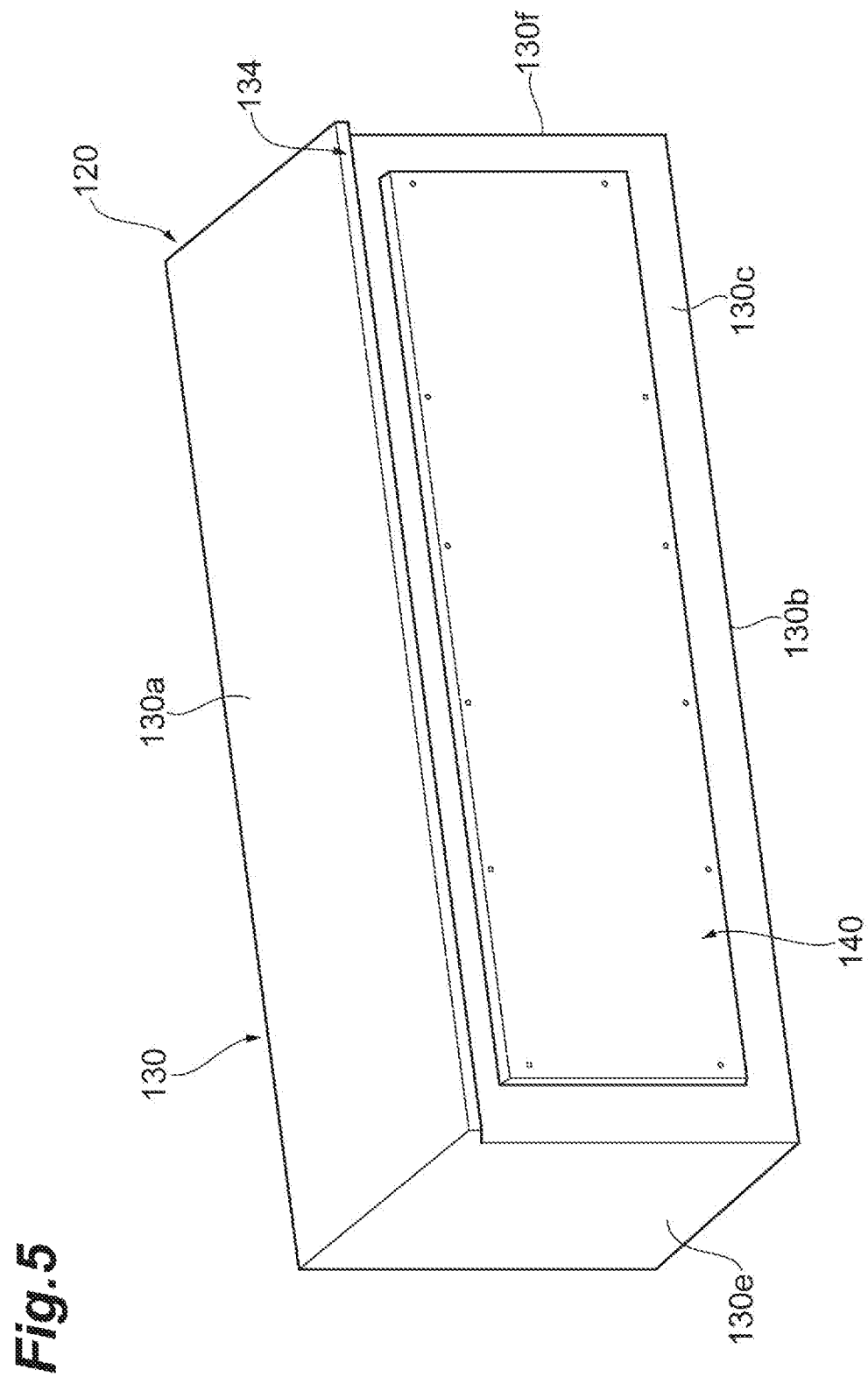
FIG. 5 is a perspective view illustrating an electric box.
Figure 6:
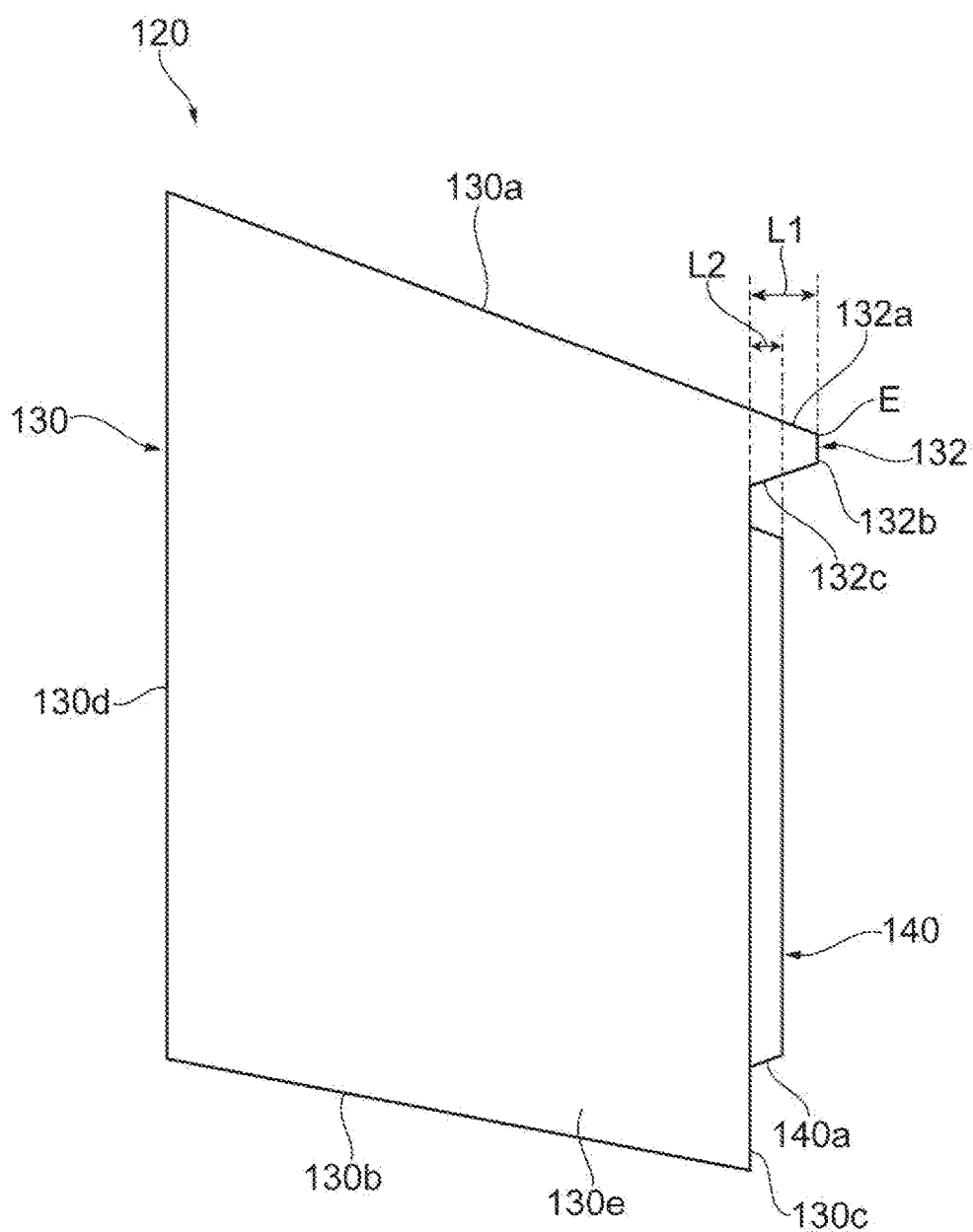
FIG. 6 is a side view of the electric box.
Figure 7:
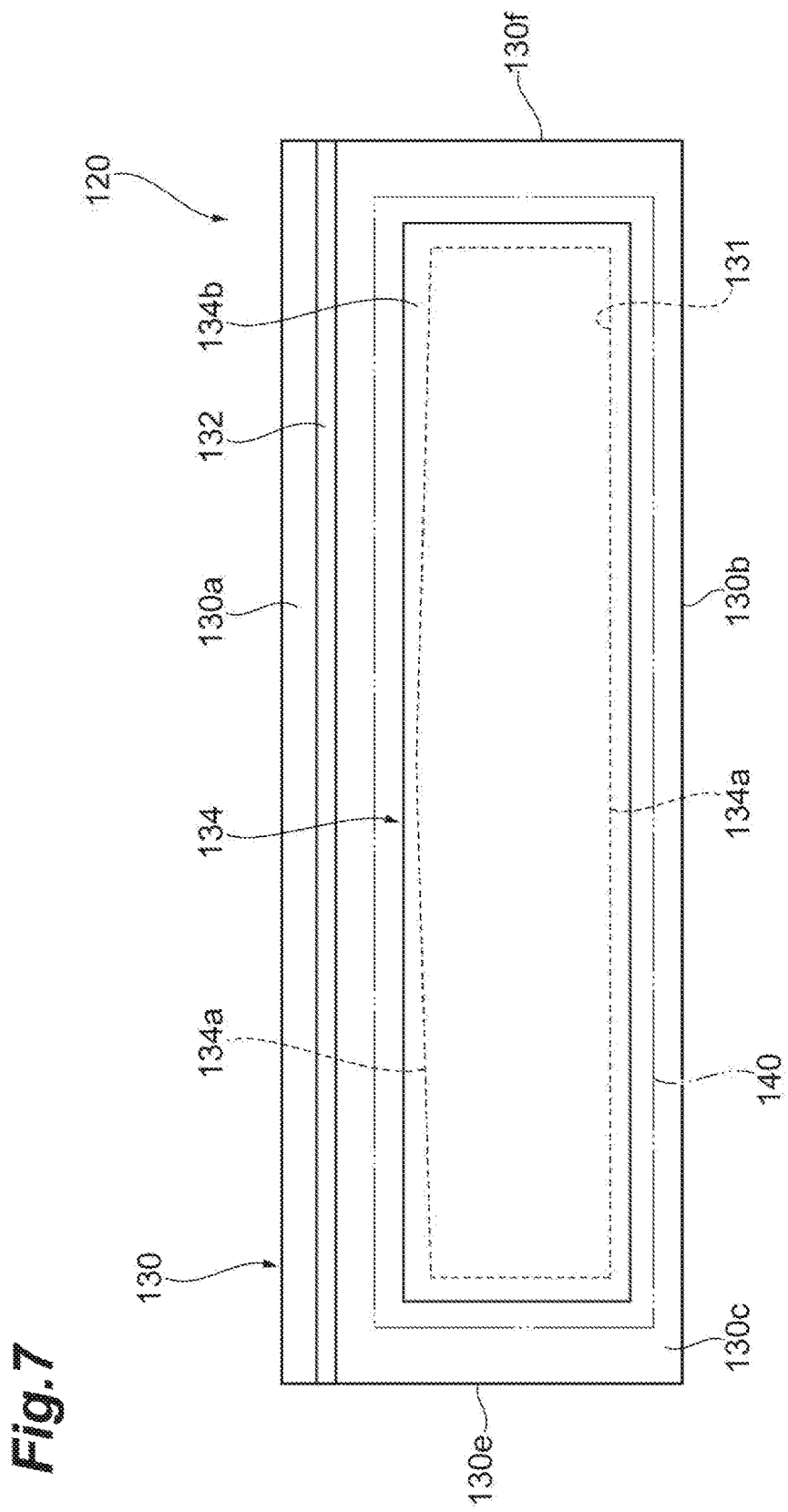
FIG. 7 is a front view of the electric box.
Figure 8:
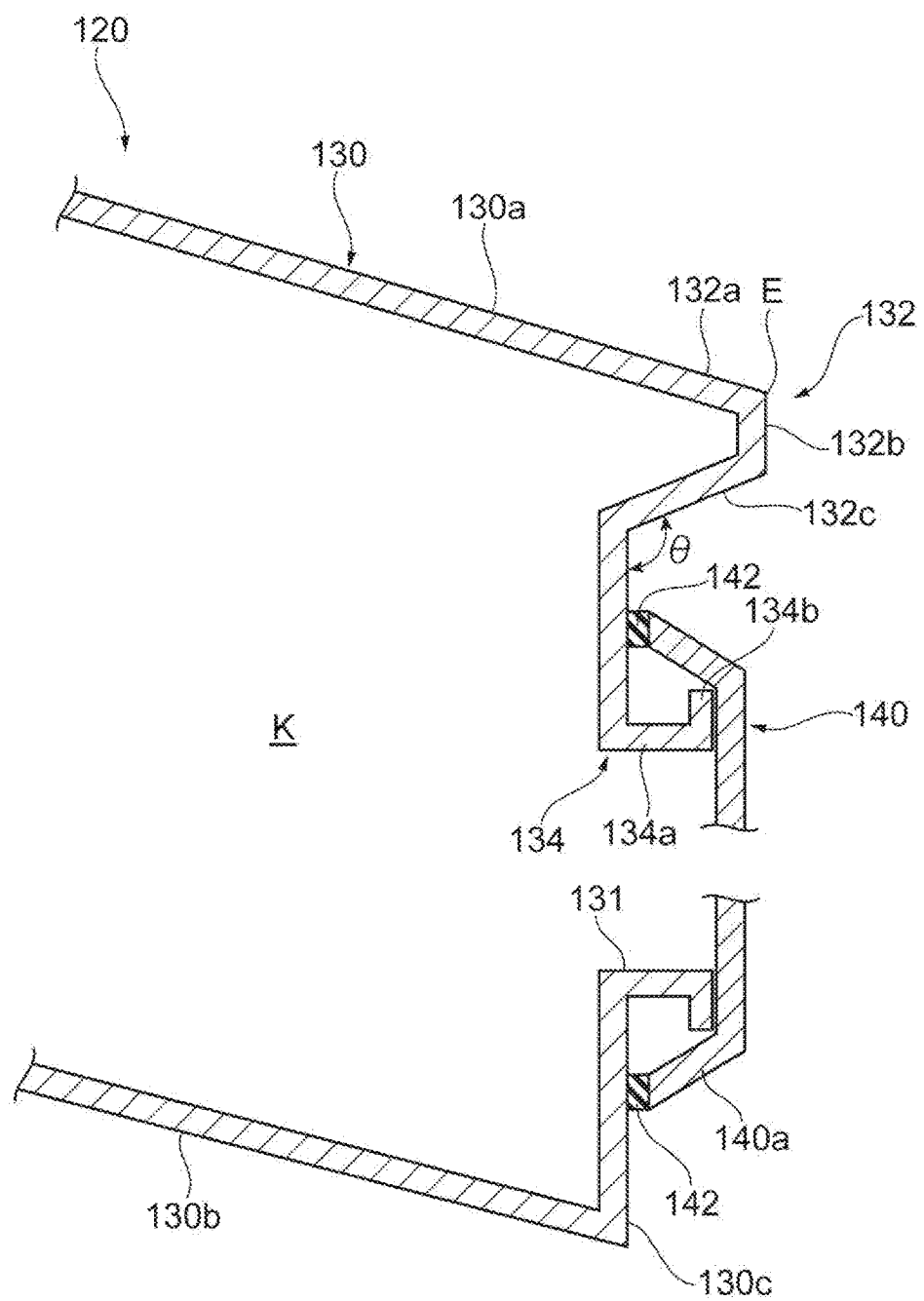
FIG. 8 is a view illustrating a sectional configuration of the electric box.

FIG. 5 is a perspective view illustrating an electric box. FIG. 6 is a side view of the electric box. FIG. 7 is a front view of the electric box. FIG. 8 is a view illustrating a sectional configuration of the electric box. In the following description, in FIG. 6, a left and right direction is referred to as a front and rear direction and an up and down direction is referred to as height direction. In FIG. 8, a left and right direction is referred to as a width direction.

The electric box 120 stores control devices of the combination weighing apparatus 1 including the control unit 100. As illustrated in FIG. 4, the electric box 120 is attached to the support columns 92 of the body frame 90. The electric box 120 and one of the support columns 92 are connected by a pipe 121. The pipe 121 is a hollow member. The pipe 121 causes the inner space of the hollow support column 92 to communicate with the inside of the electric box 120. Inside of the pipe 121, wires for electrically connecting devices and the like stored in the weighing mechanism frame 80 to devices and the like in the electric box 120 are passed.

The electric box 120 includes a storage case 130 and a lid 140. The storage case 130 and the lid 140 are formed of, for example, a plate-shaped metal member. The lid 140 is provided so as to be detachable from the storage case 130.

The storage case 130 is a box body having a storage space K in which the control devices (electric circuit portion) is stored. The storage case 130 has an upper surface 130a, a lower surface 130b, a front surface (side surface) 130c and a rear surface (the other side surface) 130d that oppose each other, and a pair of side surfaces 130e and 130f that connect the front surface 130c to the rear surface 130d and oppose each other. The upper surface 130a, the lower surface 130b, the front surface 130c, the rear surface 130d, the side surfaces 130e and 130f are flat surfaces.

The storage case 130 has a horizontally elongated shape. Specifically, in the storage case 130, the dimensions in the width direction of the front surface 130c and the rear surface 130d are greater than the dimensions in the height direction. That is, as illustrated in FIG. 7, the front surface 130c (the rear surface 130d) has a rectangular shape in a front view. The front surface 130c is provided with an opening 131. By providing the opening 131 in the front surface 130c, a wide opening area can be secured. The storage case 130 is disposed across the support columns 92 and 92 such that the longitudinal direction thereof is along the direction in which the pair of support columns 92 and 92 oppose each other. In the storage case 130, the rear surface 130d is fixed to the support column 92. Therefore, the electric box 120 is disposed so that the front surface 130c faces the outside of the apparatus body.

The upper surface 130a is inclined downward toward the outside away from the apparatus body side (the body frame 90 side). It is preferable that an upper surface 120a is inclined by 15 degrees or more with respect to the horizontal plane. The lower surface 130b is also inclined downward toward the outside away from the apparatus body side. It is preferable that the lower surface 130b is also inclined by 15 degrees or more with respect to the horizontal plane.

The storage case 130 is provided with a convex portion 132. The convex portion 132 is constituted by a first inclined surface 132a on a lower end E side of the upper surface 130a, an end surface 132b which extends from the first inclined surface 132a and extends in the up and down direction, and a second inclined surface 132c which extends from the first inclined surface 132a and the end surface 132b and is inclined in a direction opposite to the first inclined surface 132a. The angle between the first inclined surface 132a and the end surface 132b is an obtuse angle. The angle between the end surface 132b and the second inclined surface 132c is an obtuse angle. The angle θ formed between the second inclined surface 132c and the front surface 130c is an obtuse angle (θ>90 degrees). As illustrated in FIG. 7, the convex portion 132 is disposed along the front surface 130c over the entire length in the width direction of the storage case 130.

The amount of protrusion of the convex portion 132 from the front surface 130c is greater than the amount of protrusion of the lid 140 from the front surface 130c. That is, the amount of protrusion of the lower end E of the upper surface 130a from the front surface 130c is greater than the amount of protrusion of the lid 140 from the front surface 130c. As illustrated in FIG. 6, the amount of protrusion L1 of the convex portion 132 from the front surface 130c is greater than the amount of protrusion L2 of the end surface of the lid 140 from the front surface 130c (L1>L2). Accordingly, the lid 140 is positioned below the convex portion 132.

The storage case 130 has a protruding portion 134 that is covered by the lid 140. The protruding portion 134 is provided along the edge of the opening 131. The protruding portion 134 has an overhanging portion 134a and a protrusion 134b. The overhanging portion 134a overhangs from the front surface 130c toward the outside and extends along the front surface 130c. The overhanging portion 134a disposed along the upper side edge portion of the opening 131 is inclined downward such that at least one end portion in the extension direction serves as the lower end. As illustrated in FIG. 7, in this embodiment, the overhanging portion 134a is inclined downward such that both end portions in the extension direction serve as the lower ends. Specifically, the overhanging portion 134a is inclined continuously downward from the center portion toward the both end portions. The overhanging portion 134a disposed along the lower side edge portion and the side edge portion of the opening 131 form a linear shape.

The protrusion 134b extends along the front surface 130c from the tip of the overhanging portion 134a toward the outside of the opening 131. The protrusion 134b is bent by approximately 90 degrees with respect to the overhanging portion 134a. As illustrated in FIG. 8, a concave portion is formed by the front surface 13c, the overhanging portion 134a, and the protrusion 134b. Accordingly, the protruding portion 134 has a function of preventing the cleaning water or the like infiltrating through the front surface 130c from penetrating into the storage space K when the lid 140 is opened, and also has a function of flowing the cleaning water or the like.

The lid 140 has a rectangular shape. The lid 140 seals the opening 131. The lid 140 is disposed to cover the protruding portion 134 (the opening 131) of the storage case 130. The lid 140 is fixed to the storage case 130 by, for example, bolts or the like. An edge portion 140a of the lid 140 is inclined downward toward the outside. This prevents the cleaning water or the like from accumulating on the upper end portion of the lid 140. At the end portion of the lid 140, a sealing material 142 is disposed on the inside over the entire circumference. The sealing material 142 is, for example, rubber. As illustrated in FIG. 6, when the lid 140 is attached to the storage case 130, the sealing material 142 adheres to the front surface 130c.

(Operational Effects)

As described above, the combination weighing apparatus 1 according to this embodiment includes the electric box 120. The electric box 120 includes the storage case 130 and the lid 140. The storage case 130 has the upper surface 130a which is inclined downward toward the front surface 130c side. Accordingly, the cleaning water or the like adhered to the upper surface 130a flows toward the lower end. Therefore, the accumulation of the cleaning water or the like on the upper surface 130a can be prevented. In addition, the amount of protrusion of the lower end E of the upper surface 130*a* from the front surface 130*c* is greater than the amount of protrusion of the lid 140 from the front surface 130*c*. Accordingly, the cleaning water or the like discharged from the lower end E of the upper surface 130*a* is less likely to be caught on the lid. Therefore, the infiltration of the cleaning water or the like between the storage case 130 and the lid 140 can be prevented. As a result, an improvement in waterproofness can be achieved.

In this embodiment, the storage case 130 includes the protruding portion 134 which is disposed at least at the upper side edge portion of the opening 131 and is covered with the lid 140. The protruding portion 134 has the overhanging portion 134*a* which overhangs from the front surface 130*c* toward the outside and extends along the front surface 130*c*. The overhanging portion 134*a* is inclined downward such that at least one end portion in the extension direction serves as the lower end. When the lid 140 is detached from the storage case 130, the cleaning water or the like may adhere to the protruding portion 134 in some cases. At this time, since at least one end portion in the extension direction of the overhanging portion 134*a* is inclined so as to serve as the lower end, the cleaning water or the like flows along the overhanging portion 134*a* and is discharged. Therefore, the accumulation of the cleaning water or the like in the protruding portion 134 can be prevented, and the infiltration of the cleansing water or the like into the storage case 130 can be prevented.

In this embodiment, the storage case 130 is attached to the apparatus body, and the upper surface 130*a* is inclined downward from the apparatus body side toward the outside. Accordingly, the cleaning water or the like adhered to the upper surface 130*a* easily falls to the outside of the apparatus body. Therefore, it is possible to prevent the cleaning water or the like from falling to the inside of the apparatus body or immediately therebelow, and a further improvement in sanitation can be achieved.

In this embodiment, in the storage case 130, the convex portion 132, which is constituted by the first inclined surface 132*a* on the lower end E side of the upper surface 130*a*, and the second inclined surface 132*c* that extends from the lower end E of the first inclined surface 132*a* and is inclined in the direction opposite to the first inclined surface 132*a* is disposed along the front surface 130*c*. As described above, by disposing the convex portion 132 along the front surface 130*c*, the rigidity of the storage case 130 can be increased. In particular, in the configuration in which the storage case 130 is fixed to the support column 92, by increasing the rigidity of the storage case 130, the rigidity of the body frame 90 to which the storage case 130 is attached can be increased. Accordingly, disturbance such as floor vibration and vibration due to the apparatus itself can be effectively suppressed. As a result, the influence of disturbance and the like on the load cell 56 can be suppressed, and an improvement in the weighing accuracy of the load cell 56 can be achieved.

In this embodiment, the angle between the second inclined surface 132*c* and the front surface 130*c* is an obtuse angle. In a case where the corner formed by the second inclined surface 132*c* and the front surface 130*c* has an acute angle, the corner is less likely to be seen and cannot be easily cleaned. In addition, the cleaning water, articles, and the like are likely to be accumulated at the corner, and there is a concern that sanitation may be degraded. Therefore, by setting the angle between the second inclined surface 132*c* and the front surface 130*c* to be an obtuse angle, it is possible to prevent the cleaning water or the like from accumulating at the corner, thereby improving sanitation.

In this embodiment, the rear surface 130*d* is fixed to the support column 92 of the body frame 90. In this configuration, the upper surface 130*a* is inclined downward from the body frame 90 side toward the outside. Therefore, the cleaning water or the like adhered to the upper surface 130*a* easily falls to the outside of the body frame 90. Therefore, it is possible to prevent the cleaning water or the like from falling to the inside of the apparatus body or immediately therebelow, and a further improvement in sanitation can be achieved.

The present invention is not limited to the above-described embodiment. For example, in the above-described embodiment, the combination weighing apparatus has been described as an example of the article processing apparatus, but the article processing apparatus may be, for example, an X-ray inspection apparatus, a near-infrared inspection apparatus, a weight sorting apparatus, a metal inspection apparatus, or the like.

In the above-described embodiment, food has been described as an example the article, but the article may be another thing.

In the above-described embodiment, the form in which the dispersion table 20 disperses the articles using vibration has been described as an example, but the articles may be dispersed by rotating the dispersion table 20. In addition, the form in which the radial feeder 30 conveys the articles using vibration has been described as an example, but the radial feeder 30 may convey the articles for example, using a coil unit (screw) that can be rotated.

In the above-described embodiment, the form in which the lower surface 130*b* of the electric box 120 is inclined has been described as an example, but the lower surface 130*b* is not limited thereto. The lower surface 130*b* may not be inclined. From the viewpoint of sanitation, it is preferable that the lower surface 130*b* of the electric box 120 is inclined downward from the body frame 90 side toward the side away from the body frame 90.

In the above embodiment, the overhanging portion 134*a* disposed along the upper side edge portion of the opening 131 is inclined downward such that both end portions in the extension direction serve as the lower ends. However, the overhanging portion 134*a* may be inclined downward such that at least one end portion in the extension direction serves as the lower end. That is, the overhanging portion 134*a* may be configured to be continuously inclined from one end to the other end in the extension direction thereof.

In the above-described embodiment, the electric box 120 is fixed to the body frame 90, but the electric box 120 is not limited thereto. The electric box 120 may be fixed to another part of the combination weighing apparatus 1. In addition, the electric box 120 may be separately provided without being fixed to the apparatus body of the body frame 90 or the like, and wires that connect the devices and the like in the electric box 120 to the devices and the like stored in the weighing mechanism frame 80 may be configured to be laid to the electric box 120 through the inside of a flexible tube or the like.

In the above-described embodiment, the configuration in which the electric box 120 has horizontally elongated shape which is long in the width direction has been described as an example, but the electric box 120 is not limited thereto. The electric box may have a vertically elongated shape. Even in this configuration, the lid is positioned below the convex portion. With this configuration, the electric box can be disposed even when the installation area is small.

In the above-described embodiment, the configuration in which the electric box 120 includes the storage case 130 has been described as an example, but the storage case may be a part of the stand on which the support column 92 is installed. That is, the stand may be configured to have an upper surface and a side surface such that the amount of protrusion of the lower end of the upper surface from the side surface may be greater than the amount of protrusion of the lid from the side surface.

In the above-described embodiment, the form in which the upper surface 92a of the support column 92 is inclined has been described as an example, but the upper surface 92a may be a flat surface. However, in order to guide water droplets and the like adhered to the combination weighing apparatus 1 to the outside of the combination weighing apparatus 1, it is preferable that the upper surface 92a is inclined.

In the above-described embodiment, the configuration in which the collection discharge chute section 60 has the inner chute 62 and the outer chute 64 has been described as an example, but the collection discharge chute section 60 is not limited to the configuration constituted by the inner chute 62 and the outer chute 64. For example, the collection discharge chute section 60 may be constituted by a single chute.

REFERENCE SIGNS LIST

1 . . . combination weighing apparatus (article processing apparatus), 20 . . . dispersion table, 50 . . . weighing hopper, 64 . . . outer chute (collection chute), 80 . . . weighing mechanism frame (support frame), 90 . . . body frame, 130 . . . storage case, 130a . . . upper surface, 130c . . . front surface (side surface), 130d . . . rear surface (the other side surface), 132 . . . convex portion, 132a . . . first inclined surface, 132c . . . second inclined surface, 134 . . . protruding portion, 134a . . . overhanging portion, 140 . . . lid, E lower end.

The invention claimed is:

1. An article processing apparatus which is used in a production line of an article and processes the article, comprising:
 a storage case which stores an electric circuit portion and has an opening at a side surface thereof; and
 a lid which seals the opening,
 wherein the storage case has an upper surface which is inclined downward toward the side surface side,
 an amount of protrusion of a lower end of the upper surface from the side surface is greater than an amount of protrusion of the lid from the side surface,
 the storage case includes a protruding portion which is disposed along at least an upper side edge portion of the opening and is covered by the lid,
 the protruding portion has an overhanging portion which overhangs toward outside from the side surface and extends along the side surface, and
 the overhanging portion is inclined downward from a middle towards a distal end such that at least one end portion in an extension direction thereof serves as a lower end.

2. The article processing apparatus according to claim 1,
 wherein the storage case is attached to an apparatus body, and
 the upper surface is inclined downward from the apparatus body side toward the outside.

3. An article processing apparatus which is used in a production line of an article and processes the article, comprising:
 a storage case which stores an electric circuit portion and has an opening at a side surface thereof; and
 a lid which seals the opening,
 wherein the storage case has an upper surface which is inclined downward toward the side surface side,
 an amount of protrusion of a lower end of the upper surface from the side surface is greater than an amount of protrusion of the lid from the side surface, and
 in the storage case, a convex portion, which is constituted by a first inclined surface on the lower end side of the upper surface, and a second inclined surface that extends from the lower end of the first inclined surface and is inclined in a direction opposite to the first inclined surface is disposed along the side surface.

4. The article processing apparatus according to claim 3,
 wherein an angle between the second inclined surface and the side surface is an obtuse angle.

5. The article processing apparatus according to claim 1, further comprising:
 a dispersion table which disperses the article;
 a plurality of weighing hoppers which weigh the article supplied from the dispersion table; and
 a collection chute which is disposed below the weighing hoppers and collects the article discharged from the weighing hoppers.

6. The article processing apparatus according to claim 5, further comprising:
 a support frame which supports the dispersion table and the plurality of weighing hoppers; and
 a body frame which supports the support frame,
 wherein the other side surface of the storage case which opposes the side surface is fixed to the body frame and is attached to the body frame.

* * * * *